(12) United States Patent
Lee et al.

(10) Patent No.: US 10,431,560 B2
(45) Date of Patent: Oct. 1, 2019

(54) MOLDED SEMICONDUCTOR PACKAGE HAVING AN OPTICAL INSPECTION FEATURE

(71) Applicant: Infineon Technologies AG, Neubiberg (DE)

(72) Inventors: Swee Kah Lee, Melaka (MY); Hock Heng Chong, Melaka (MY); Mei Chin Ng, Melaka (MY); Aileen Manantan Soriano, Villasis (PH); Fong Mei Lum, Melaka (MY); Muhammad Muhammat Sanusi, Sungai Petani (MY); Soon Lock Goh, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/730,174

(22) Filed: Oct. 11, 2017

(65) Prior Publication Data
US 2018/0033752 A1 Feb. 1, 2018

Related U.S. Application Data

(62) Division of application No. 15/059,827, filed on Mar. 3, 2016, now Pat. No. 9,806,043.

(51) Int. Cl.
*H01L 23/00* (2006.01)
*H01L 23/495* (2006.01)
(Continued)

(52) U.S. Cl.
CPC .......... *H01L 24/06* (2013.01); *H01L 21/6836* (2013.01); *H01L 21/78* (2013.01);
(Continued)

(58) Field of Classification Search
CPC ......... H01L 23/49582; H01L 23/49503; H01L 2224/48247; H01L 24/06; H01L 23/49548;
(Continued)

(56) References Cited

U.S. PATENT DOCUMENTS

| 5,816,478 A | 10/1998 | Kaskoun et al. |
| 6,111,312 A * | 8/2000 | Hirumuta ............ H01L 23/3107 257/666 |

(Continued)

FOREIGN PATENT DOCUMENTS

| CN | 103646938 A | 3/2014 |
| EP | 2980845 A1 | 2/2016 |
| WO | 2001056081 A1 | 8/2001 |

OTHER PUBLICATIONS

Smith, Lee, "Leadless Lead Frame Packaging for Automotive and High-Density Requirements", The Future of Semiconductor Packaging, United Test and Assembly Center (UTAC), San Jose, CA, Chip Scale Review Magazine, 2015, pp. 1-11.
(Continued)

*Primary Examiner* — Sonya D. McCall-Shepard
(74) *Attorney, Agent, or Firm* — Murphy, Bilak & Homiller, PLLC

(57) ABSTRACT

A molded semiconductor package includes a mold compound having opposing first and second main surfaces and an edge extending between the first and second main surfaces. A semiconductor die is embedded in the mold compound. A plurality of metal pads embedded in the mold compound are electrically connected to the semiconductor die. The metal pads have a bottom face which is uncovered by the mold compound at the second main surface of the mold compound. The metal pads disposed around a periphery of the molded package have a side face which is uncovered by the mold compound at the edge of the mold
(Continued)

compound. The faces of the metal pads uncovered by the mold compound are plated. The side face of each metal pad disposed around the periphery of the molded package is recessed inward from the edge of the mold compound. A corresponding manufacturing method is also described.

21 Claims, 8 Drawing Sheets

(51) Int. Cl.
*H01L 21/78* (2006.01)
*H01L 23/29* (2006.01)
*H01L 23/31* (2006.01)
*H01L 21/683* (2006.01)

(52) U.S. Cl.
CPC ........ *H01L 23/293* (2013.01); *H01L 23/3121* (2013.01); *H01L 23/49503* (2013.01); *H01L 23/49541* (2013.01); *H01L 23/49548* (2013.01); *H01L 23/49582* (2013.01); *H01L 24/03* (2013.01); H01L 2224/0381 (2013.01); H01L 2224/03825 (2013.01); H01L 2224/05655 (2013.01); H01L 2224/16245 (2013.01); H01L 2224/32245 (2013.01); H01L 2224/48091 (2013.01); H01L 2224/48247 (2013.01); H01L 2224/73265 (2013.01)

(58) Field of Classification Search
CPC ... H01L 23/49541; H01L 24/03; H01L 21/78; H01L 23/3121; H01L 21/6836; H01L 2224/73265; H01L 2224/48091; H01L 2224/32245
See application file for complete search history.

(56) References Cited

U.S. PATENT DOCUMENTS

| | | | |
|---|---|---|---|
| 6,362,089 B1* | 3/2002 | Molla | H01L 21/288 |
| | | | 106/1.23 |
| 7,508,066 B2 | 3/2009 | Huang et al. | |
| 7,656,034 B2* | 2/2010 | Iguchi | H01L 23/4952 |
| | | | 257/737 |
| 8,008,784 B2 | 8/2011 | Hong et al. | |
| 8,820,612 B2 | 9/2014 | Feger et al. | |
| 8,933,545 B2 | 1/2015 | Gong et al. | |
| 9,601,415 B2* | 3/2017 | Makino | H01L 23/49541 |
| 2002/0011656 A1* | 1/2002 | Swanson | H01L 21/56 |
| | | | 257/697 |
| 2008/0246132 A1 | 10/2008 | Kasuya et al. | |
| 2009/0155955 A1 | 6/2009 | Liang | |
| 2010/0001291 A1* | 1/2010 | Otremba | H01L 21/561 |
| | | | 257/77 |
| 2010/0187663 A1 | 7/2010 | Celaya et al. | |
| 2011/0233755 A1 | 9/2011 | Kim et al. | |
| 2013/0017652 A1 | 1/2013 | Tsui et al. | |
| 2014/0035113 A1 | 2/2014 | Kerse | |
| 2014/0225239 A1 | 8/2014 | Kimura | |
| 2014/0287554 A1 | 9/2014 | Higgins | |
| 2015/0235914 A1 | 8/2015 | Lin et al. | |
| 2015/0262918 A1 | 9/2015 | Tran et al. | |

OTHER PUBLICATIONS

Walczyk, S. et al., "Next Generation Leadiess RF Packages Utilizing 1st Level Low Cost Flip Chip Interconnect Technology", Microelectronics and Packaging Conference, Rimini, Italy, Jun. 15-18, 2009, pp. 1-6.

* cited by examiner

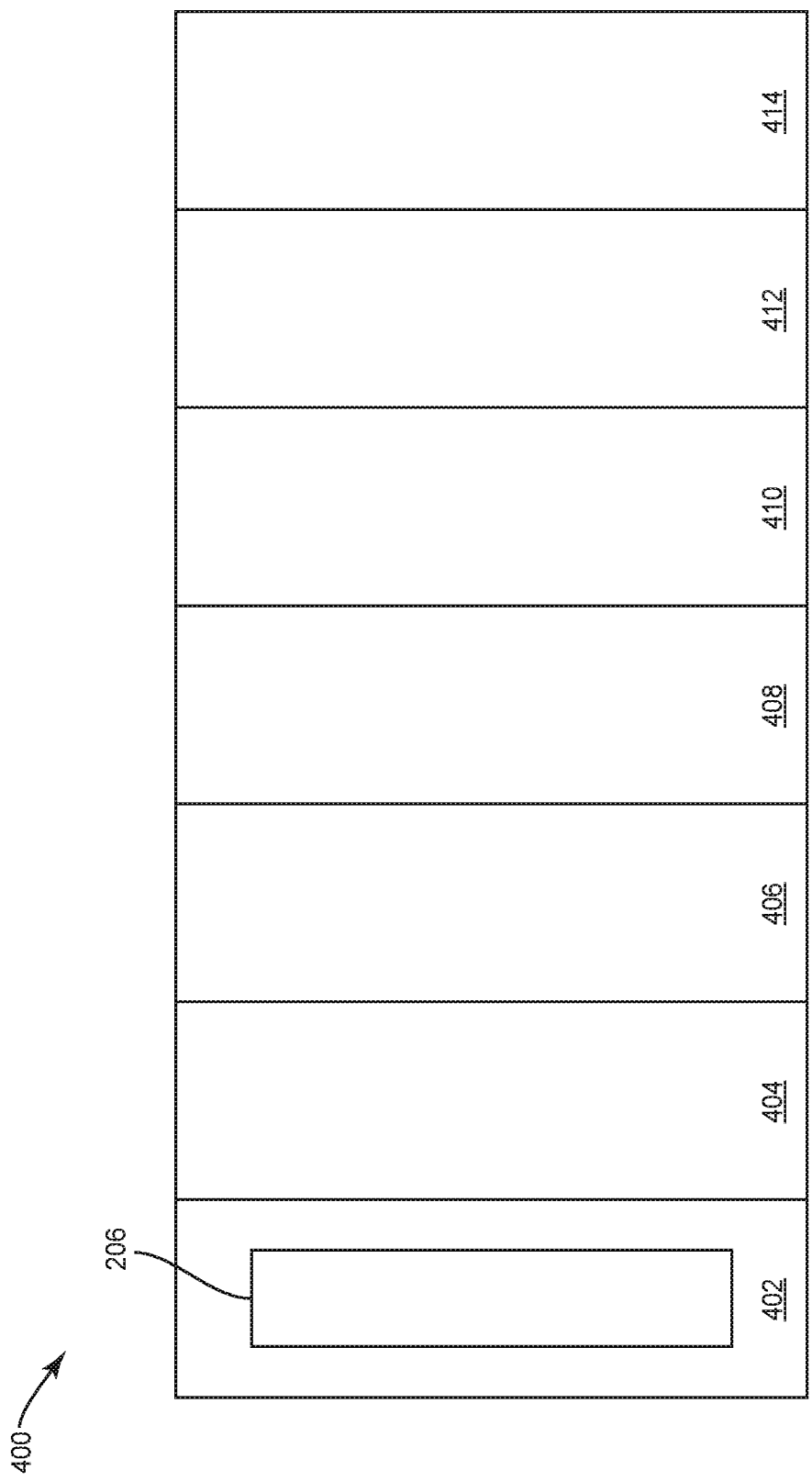

MOLDED SEMICONDUCTOR PACKAGE HAVING AN OPTICAL INSPECTION FEATURE

TECHNICAL FIELD

The instant application relates to molded semiconductor packages, and more particularly to molded semiconductor packages having an optical inspection feature.

BACKGROUND

Many type of molded semiconductor packages have a so-called LTI (lead tip inspection) feature at the edge of the molded package to allow for optical inspection of the joint or bond between the metal pads of the molded package and a substrate to which the molded package is attached such as a circuit board. The LTI feature is the portion of a metal pad at the periphery of a molded package which extends to the edge of the molded package and is uncovered by the mold compound, thus allowing for optical inspection from the side.

Individual molded packages are typically formed from a molded substrate which includes a number of semiconductor dies and metal pads electrically connected to the dies. The semiconductor dies and the metal pads are embedded in a mold compound. The metal pads are uncovered at the bottom surface of the mold compound. Metal pads of adjacent packages are connected. These connections are severed by a mechanical sawing process. The exposed part of each cut metal pad forms an LTI feature at the side of the individual molded package, which is uncovered by mold compound as a result of the package singulation process.

However, a two-step sawing process is typically employed to realize LTI features. Also, metal burrs are often present on the LTI features as a result of the two-step sawing process. The metal material of the pads can smear during sawing. In both cases, the likelihood of successful optical detection is reduced due to the degraded LTI feature. Alternatively, LTI features can be realized by a selective etching process with electroless plating. However, selective etching is limited to the leadframe supplier and requires a suitable anisotropic copper etchant.

As such, a simpler and more cost effective technique is needed for manufacturing molded semiconductor packages having an optical inspection feature.

SUMMARY

According to an embodiment of a method of manufacturing molded semiconductor packages, the method comprises: providing a molded semiconductor substrate comprising a mold compound in which semiconductor dies and metal pads are embedded, each metal pad being electrically connected to one of the semiconductor dies and uncovered by the mold compound at a first main surface of the mold compound; singulating the molded semiconductor substrate into individual molded packages each of which comprises one or more of the semiconductor dies and the corresponding metal pads, each metal pad having a bottom face uncovered by the mold compound at the first main surface, the metal pads disposed around a periphery of each molded package also having a side face uncovered by the mold compound at an edge along which the molded packages were singulated; immersing the molded packages in a chemical bath which roughens the bottom face of each metal pad and removes burrs from the side face of the metal pads disposed around the periphery of each molded package; and plating the faces of the metal pads uncovered by the mold compound after immersing the molded packages in the chemical bath.

According to an embodiment of a molded semiconductor package, the molded semiconductor package comprises a mold compound having a first main surface, a second main surface opposite the main surface, and an edge extending between the first and the second main surfaces, a semiconductor die embedded in the mold compound, and a plurality of metal pads embedded in the mold compound and electrically connected to the semiconductor die. The metal pads have a bottom face which is uncovered by the mold compound at the second main surface of the mold compound. The metal pads disposed around a periphery of the molded package have a side face which is uncovered by the mold compound at the edge of the mold compound. The faces of the metal pads uncovered by the mold compound are plated. The side face of each metal pad disposed around the periphery of the molded package is recessed inward from the edge of the mold compound.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 5 illustrates an embodiment of a multi-stage tool having separate compartments or immersion tanks for implementing the roughening/be-burring and plating processes shown in FIG. 4.

DETAILED DESCRIPTION

According to embodiments described herein, leadless molded semiconductor packages such as QFN (quad-flat no-leads), DFN (dual-flat no-leads), TSNP (Thin Small Non Leaded Package), etc. are manufactured from molded substrates and have an optical inspection feature also referred to herein as a lead tip inspection (LTI) feature at the edge of the individual molded packages. Leadless semiconductor packaging technology, also commonly known as MLP (micro leadframe) and SON (small-outline no leads), is a surface-mount technology for connecting integrated circuits (ICs) to surfaces of printed circuit boards (PCBs) without through-hole connections. The leadless semiconductor packages described herein are manufactured by singulating molded semiconductor substrates into individual molded packages using a single-step sawing process and then plating the LTI feature. This way, exposed surfaces of the metal pads of the individual packages can be roughened and the LTI feature plated after singulation.

Figure 1:
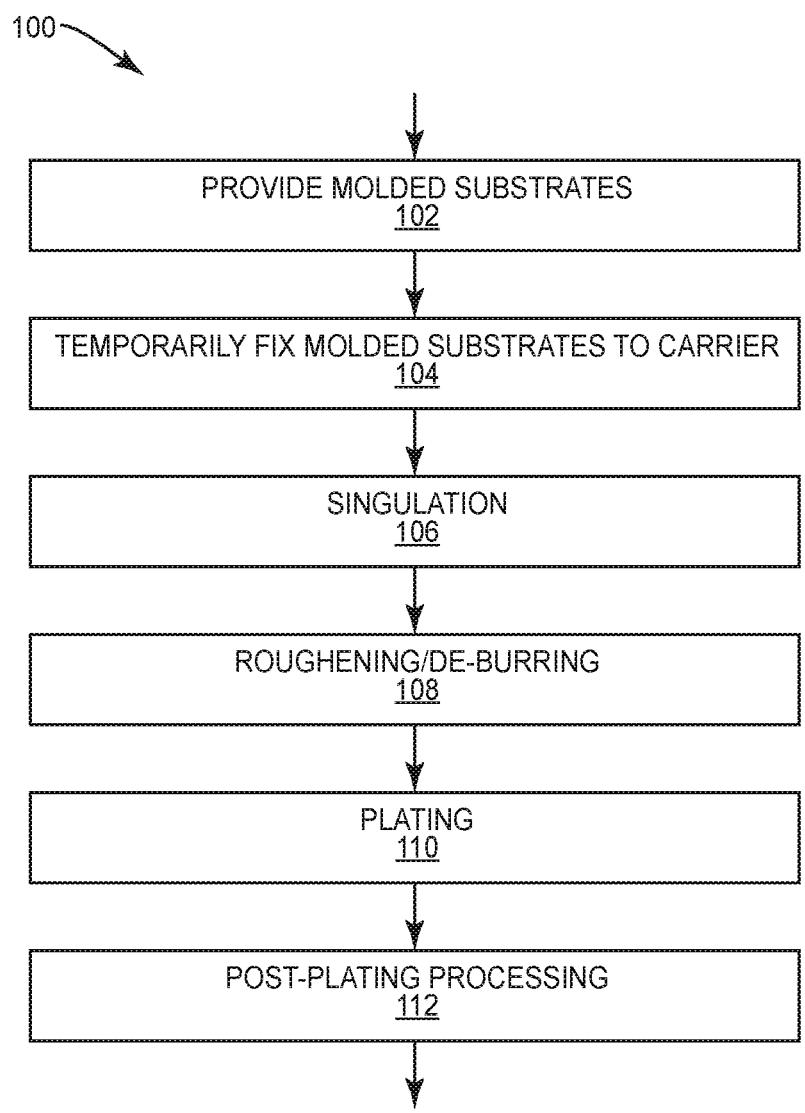
FIG. 1 illustrates a flow diagram of an embodiment of a method of manufacturing molded semiconductor packages having an optical inspection feature.

FIG. 1 illustrates an embodiment of a method 100 of manufacturing molded semiconductor packages from molded semiconductor substrates 200. The method 100 is described with reference to FIGS. 2 and 3 which illustrate a plurality of molded semiconductor substrates 200 during different stages of the manufacturing process.

The method 100 includes providing the molded semiconductor substrates 200 (Block 102), each of which comprises a mold compound 202 in which semiconductor dies (out of view) and metal pads 204 are embedded. Each metal pad 204 is electrically connected to one of the semiconductor dies and uncovered by the mold compound 202 at the bottom surface of the mold compound 202 which is the surface of the mold compound 202 visible in the exploded view of FIGS. 2 and 3. Any standard process for fabricating the molded semiconductor substrates 200 can be used. For example, the metal pads 204 can be realized by leads of a leadframe strip. The semiconductor dies can be attached to die paddles of the leadframe strip in the case of a wire bond configuration. In the case of a flip-chip configuration, the terminals of the semiconductor dies can be connected to metal pads 204 under the dies e.g. by metal pillars. In either die configuration, the dies and metal pads 204 are embedded in a mold compound 202. The bottom surface of the metal pads 204 contacts a substrate during manufacturing of the molded substrates 200 and therefore is not covered by the mold compound 202 at the bottom main surface of the mold compound 202.

More than one molded semiconductor substrate 200 can be temporarily fixed to a carrier 206 such as a substrate or UV curable tape 208 (Block 104). In the case of a UV curable tape 208, the UV curable tape 208 the UV curable tape has a heat resistance and a chemical resistance such that the UV curable tape 208 can withstand the chemical bath. The UV curable tape 208 can comprise a base film, an adhesive on the base film, and a liner on the adhesive. In one embodiment, the base film comprises polyolefin, the adhesive comprises acrylic, and the liner comprises polyethylene terephthalate.

Figure 2:
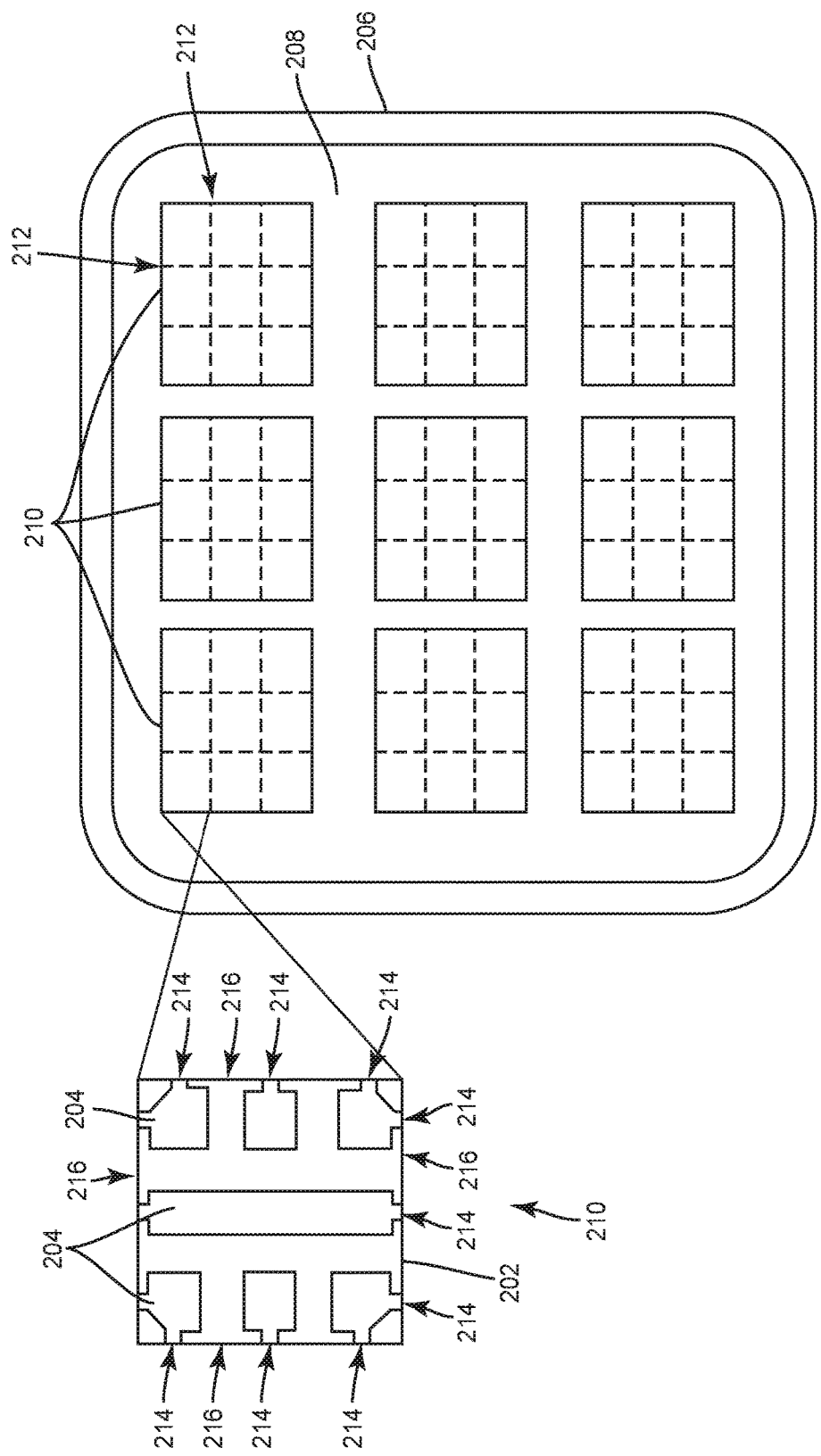
FIGS. 2 and 3 illustrate respective top down plan views of molded semiconductor substrates during different stages of the manufacturing process shown in FIG. 1.

The individual molded semiconductor packages 210 to be formed from each molded semiconductor substrate 200 are illustrated by dashed boxes in FIG. 2 because they have not yet been singulated at this point in the manufacturing process i.e. not yet separated into individual packages e.g. by sawing. The exploded view in FIGS. 2 and 3 shows one of the individual molded packages 210 before singulation (FIG. 2) and after singulation (FIG. 3).

The molded semiconductor substrates 200 are then singulated along sawing streets 212 into individual molded packages 210 (Block 106). The term 'singulation' as used herein refers generally to the act or process of separating conjoined units into individual molded packages 210. In one embodiment, the molded semiconductor substrates 200 are singulated using a single-step sawing process in which a saw blade cuts through the mold compound 202 along each sawing street 212 only one time. As such, a two-step sawing process is avoided where the mold compound is partially cut, further processing is performed such as chemical etching, and then the mold compound is cut a second time along the same sawing streets to complete the singulation of the individual molded packages. Avoiding such a two-step sawing process reduces the overall cost of the individual molded packages. The molded semiconductor substrates 200 are illustrated by dashed boxes in FIG. 3 because they have been singulated at this point in the process and therefore separated into individual molded packages 210.

Each individual molded semiconductor package 210 comprises one or more of the semiconductor dies (not shown) and the corresponding metal pads 204 electrically connected to the respective dies. Each metal pad 204 has a bottom face uncovered by the mold compound 202 at the bottom surface of the mold compound 202 as shown in the exploded views of FIGS. 2 and 3. The metal pads 204 disposed around the periphery of each molded package 210 also having a side face 214 uncovered by the mold compound 202 at the edge 216 along which the molded packages 210 were singulated. The uncovered side face 214 of the metal pads 204 disposed around the periphery of each molded package 210 forms an LTI feature, which is realized by cutting through connected metal pads 204 along the sawing streets 212 as part of the single-step sawing process.

Figure 3:
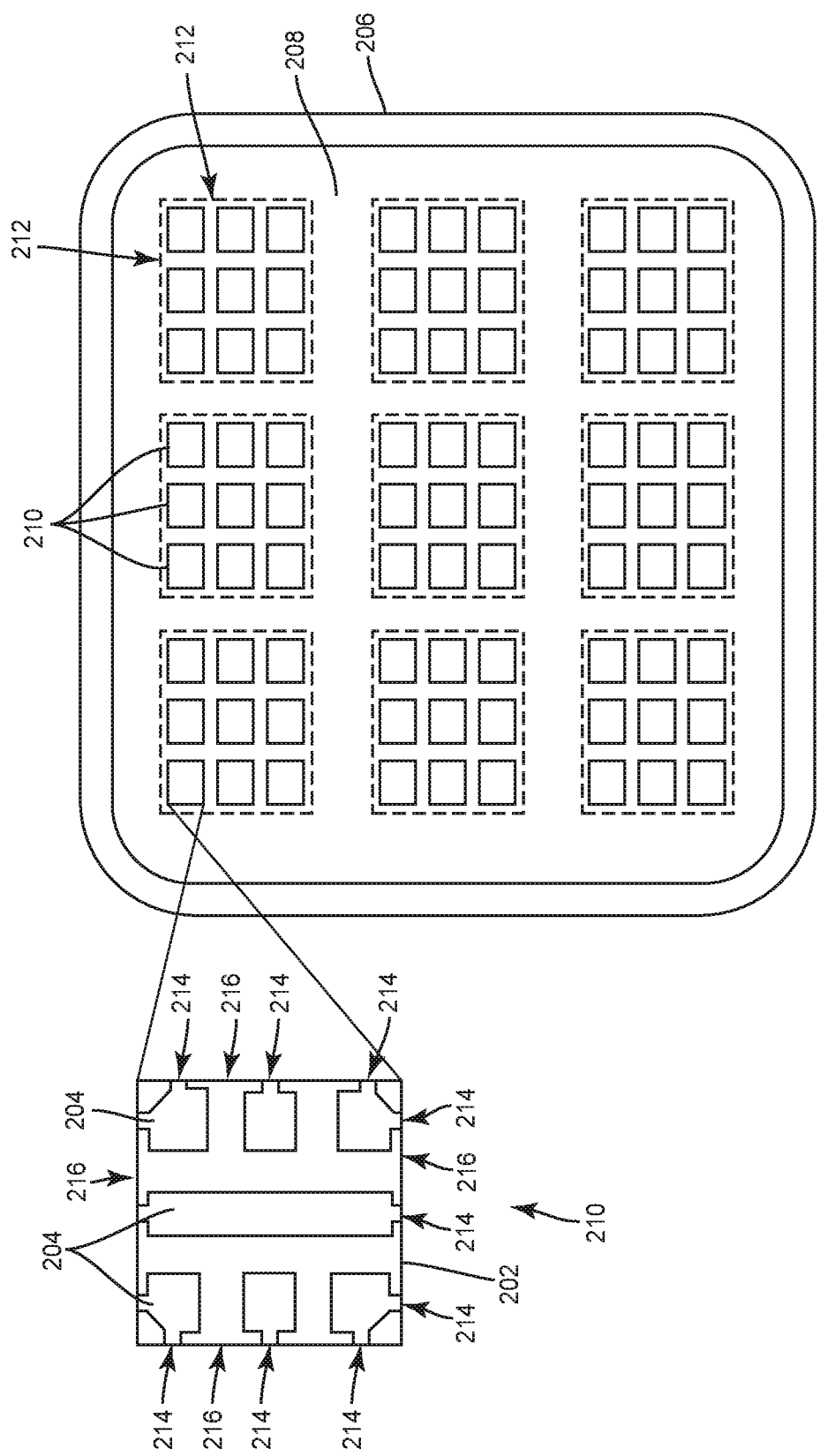

The carrier 206 still holds the individual molded semiconductor packages 210 after singulation as shown in FIG. 3. The carrier 206 with the individual molded semiconductor packages 210 temporarily attached thereto is then immersed in a chemical bath (Block 108). The chemical bath roughens the bottom face of each metal pad 204 and the side face 214 of the metal pads 204 disposed around the periphery of each molded package 210. By roughening the faces of the metal pads 204 uncovered by the mold compound 202, the surface area for plating is increased which ensures that the plating is more likely to attach/adhere to the exposed faces of the metal pads 204. The side face 214 of the metal pads 204 disposed around the periphery of each molded package 210 is likely to have burrs i.e. rough edges or ridges left by the action of the sawing blade. The chemical bath removes the burrs from the side face 214 of the metal pads 204 disposed around the periphery of each molded package 210. The faces of the metal pads 204 uncovered by the mold compound 202 are plated after immersion in the chemical bath (Block 110). The molded semiconductor packages 210 can be subjected to post-plating processes such as auto-inspection, testing, carrier removal, taping, etc. (Block 112).

Figure 4:
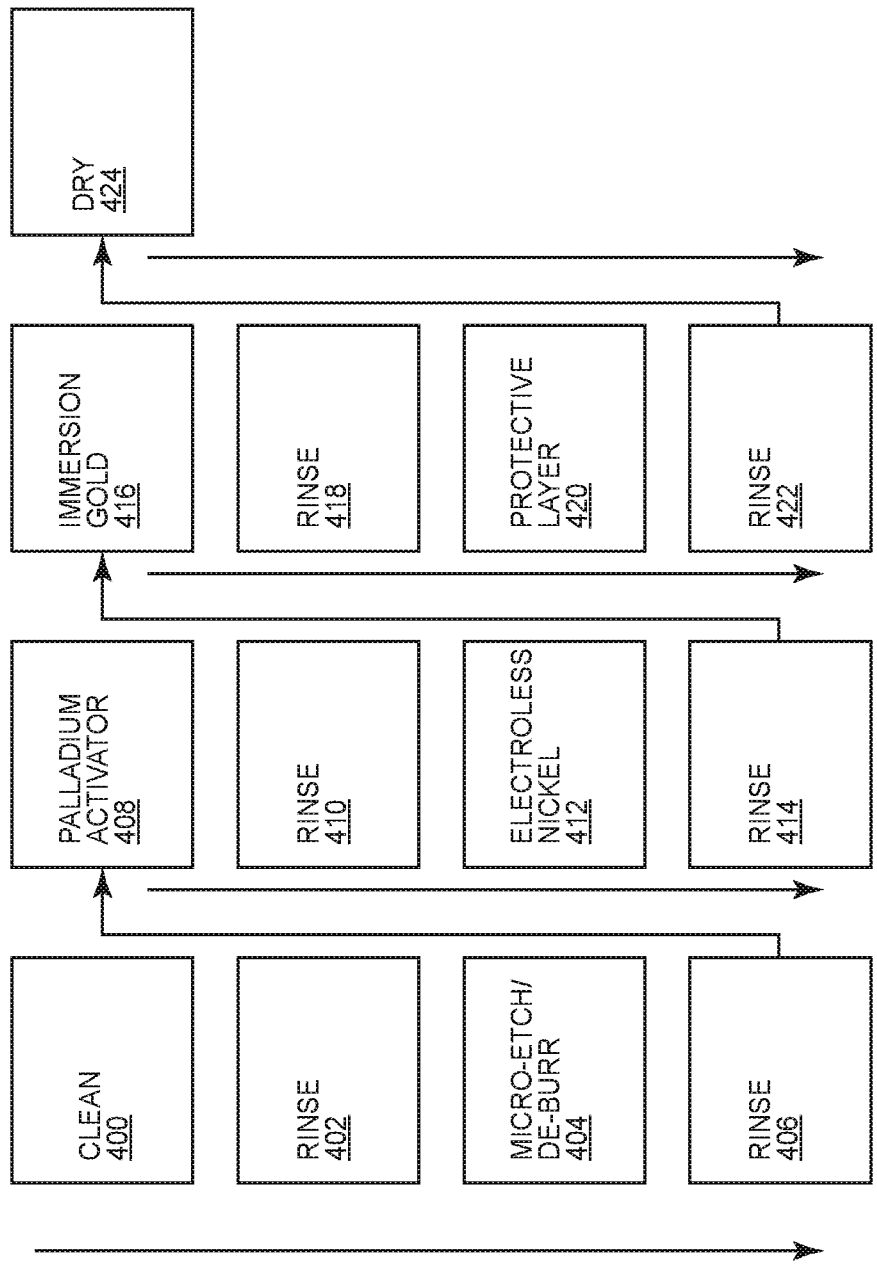
FIG. 4 illustrates a more detailed flow diagram of the roughening/be-burring and plating processes of the method shown in FIG. 1.

FIG. 4 illustrates in more detail an embodiment of the roughening/be-burring and plating processes 108, 110 included in the method 100 of FIG. 1. FIG. 4 is described with reference to FIG. 5 which illustrates generically a multi-stage tool 400 having separate compartments or immersion tanks 402-414 for implementing the roughening/be-burring and plating processes 108, 110 illustrated in FIG. 4.

After singulation and before immersion in the chemical bath, the molded semiconductor packages 210 are cleaned by a cleaning solution (Block 400). This can include immersing the carrier 206 with the molded semiconductor packages 210 attached thereto in a first compartment/immersion tank 402 of the multi-stage tool 400 shown in FIG. 5, the first compartment/immersion tank 402 being filled with a cleaning solution such as an acidic solution like HCl at e.g. 10% concentration.

Next, the carrier 206 with the molded semiconductor packages 210 attached thereto is transferred to a second compartment/immersion tank 404 of the multi-stage tool 400 shown in FIG. 5, the second compartment/immersion tank 404 having spray nozzles for rinsing the molded packages 210 one or more times so as to remove the cleaning solution and residue from the cleaning process (Block 402).

The carrier 206 with the molded semiconductor packages 210 attached thereto is then transferred to a third compartment/immersion tank 406 of the multi-stage tool 400 shown in FIG. 5 (Block 404). The third compartment/immersion tank 406 is filled with the chemical bath which roughens the bottom face of each metal pad 204 and removes burrs from the side face 214 of the metal pads 204 disposed around the periphery of each molded package 210. Between about 3 to 15 microns of metal is etched away from the faces of the metal pads 204 uncovered by the mold compound 202 while the molded packages 210 are immersed in the chemical bath. In one embodiment, the chemical bath comprises sodium persulfate which is the sodium salt of persulfate, also referred to as peroxydisulfate. More generally, the chemical bath can be selected from the group consisting of: a hydrogen peroxide solution; a ferric chloride solution; a salt solution; copper sulfate; and ferric sulfate.

The carrier 206 with the molded semiconductor packages 210 attached thereto is then transferred back to the second compartment/immersion tank 404 of the multi-stage tool 400 shown in FIG. 5 for one or more rinse cycles to remove the chemical bath solution and residue from the roughening/be-burring process (Block 406). The faces of the metal pads 204 uncovered by the mold compound 202 are then plated by electroless plating.

In one embodiment, the electroless plating process is an electroless nickel immersion gold (ENIG) process in which a layer of nickel-phosphorus or nickel-boron alloy is deposited on the faces of the metal pads 204 uncovered by the mold compound 202 and then covered with a layer of gold. The ENIG process can include transferring the carrier 206 with the molded semiconductor packages 210 attached thereto to a fourth compartment/immersion tank 408 of the multi-stage tool 400 shown in FIG. 5 (Block 408). A catalyst for electroless plating is introduced in the fourth compartment/immersion tank 408. For example, in the case of the metal pads 204 comprising copper, the catalyst can comprise palladium. This way, the faces of the metal pads 204 uncovered by the mold compound 202 can have a palladium-catalyzed copper surface prior to the plating process. An additional electroless palladium layer can be plated for magnetic sensitive products.

The carrier 206 with the molded semiconductor packages 210 attached thereto is again transferred back to the second compartment/immersion tank 404 of the multi-stage tool 400 shown in FIG. 5 for one or more rinse cycles to remove inactivated palladium and residue from the palladium surface activation process (Block 410).

The carrier 206 with the molded semiconductor packages 210 attached thereto is then transferred to a fifth compartment/immersion tank 410 of the multi-stage tool 400 shown in FIG. 5 (Block 412). A layer of nickel-phosphorus or nickel-boron alloy is deposited on the faces of the metal pads 204 uncovered by the mold compound 202 as part of an electroless nickel plating process carried out in the fifth compartment/immersion tank 410.

The carrier 206 with the molded semiconductor packages 210 attached thereto is transferred back to the second compartment/immersion tank 404 of the multi-stage tool 400 shown in FIG. 5 for one or more rinse cycles to remove residue from the electroless nickel deposition process (Block 414).

The carrier 206 with the molded semiconductor packages 210 attached thereto is then transferred to a sixth compartment/immersion tank 412 of the multi-stage tool 400 shown in FIG. 5 (Block 416). The molded packages 210 are immersed in a gold solution in the sixth compartment/immersion tank 412 so as to form a layer of gold of the nickel-plated faces of the metal pads 204. The gold layer protects the underlying nickel from oxidation. In the case of an electroless nickel/palladium immersion gold (ENEPIG) plating process, a barrier is provided between the electroless nickel layer and the gold layer which prevents nickel corrosion. Also, an optional electroless palladium layer can be added for magnetic sensitive products.

The carrier 206 with the molded semiconductor packages 210 attached thereto is transferred back to the second compartment/immersion tank 404 of the multi-stage tool 400 shown in FIG. 5 for one or more rinse cycles to remove residue from the gold immersion process (Block 418).

The carrier 206 with the molded semiconductor packages 210 attached thereto is then transferred to a seventh compartment/immersion tank 414 of the multi-stage tool 400 shown in FIG. 5 (Block 420). The nickel-gold plated faces of the metal pads 204 are covered with a protective layer in the seventh compartment/immersion tank 414. In one embodiment, the protective layer is a high temperature antioxidant coating. The protective layer can comprise an organic compound such as organophosphorous, organaosilane or a mixture of organophosphorous and organaosilane.

The carrier 206 with the molded semiconductor packages 210 attached thereto is transferred back to the second compartment/immersion tank 404 of the multi-stage tool 400 shown in FIG. 5 for one or more rinse cycles to remove residue from the protective layer coating process (Block 422). The carrier 206 and the molded semiconductor packages 210 are then dried e.g. in an oven (Block 424).

Figure 7:
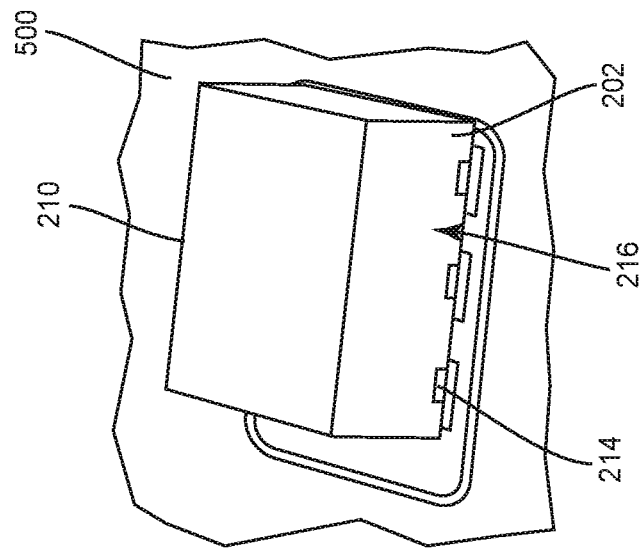
FIG. 7 illustrates a side perspective view of the molded semiconductor package of FIG. 6 soldered to a circuit board.
Figure 6:
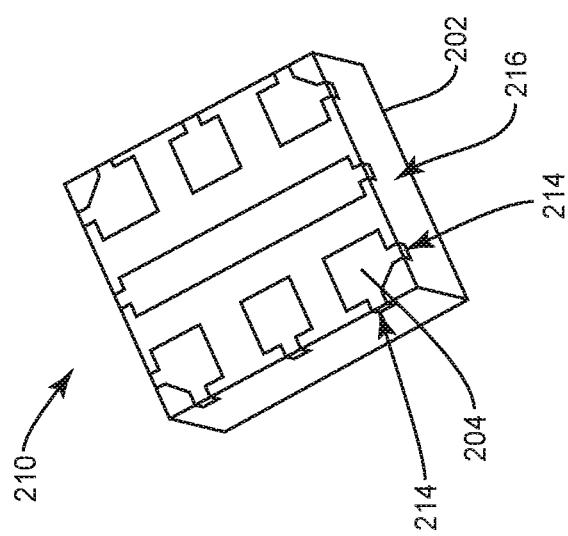
FIG. 6 illustrates a bottom perspective view of a molded semiconductor package manufactured in accordance with the method described in accordance with FIGS. 1 through 5.

FIG. 6 illustrates a bottom perspective view of a molded semiconductor package 210 manufactured in accordance with the method described above in connection with FIGS. 1 through 5. FIG. 7 illustrates a side perspective view of the molded semiconductor package 210 soldered to a circuit board 500. For the metal pads 204 disposed around the periphery of the molded package 210, a continuous plated surface extends from the bottom face of the metal pads 204 i.e. the face adjacent the circuit board 500 to the side face 214 which is uncovered by the mold compound 202 at the edge 216 of the (cut) mold compound 202. As such, there is no step profile in the plating nor in the LTI feature on all four sides of the molded package 210. Moreover, the plated surfaces of the metal pads 204 can be covered by a protective layer such as an antioxidant coating and which can comprise an organic compound as explained above. The antioxidant coating can act as an adhesion promoter and therefore enable fluxless soldering of the molded package 210 to the circuit board 500. As such, a direct metal pad-to-solder connection can be realized. The plated LTI feature at the side face 214 of the metal pads 204 disposed around the periphery of the molded package 210 is visible after attachment to the circuit board 500 in FIG. 7.

Figure 8:
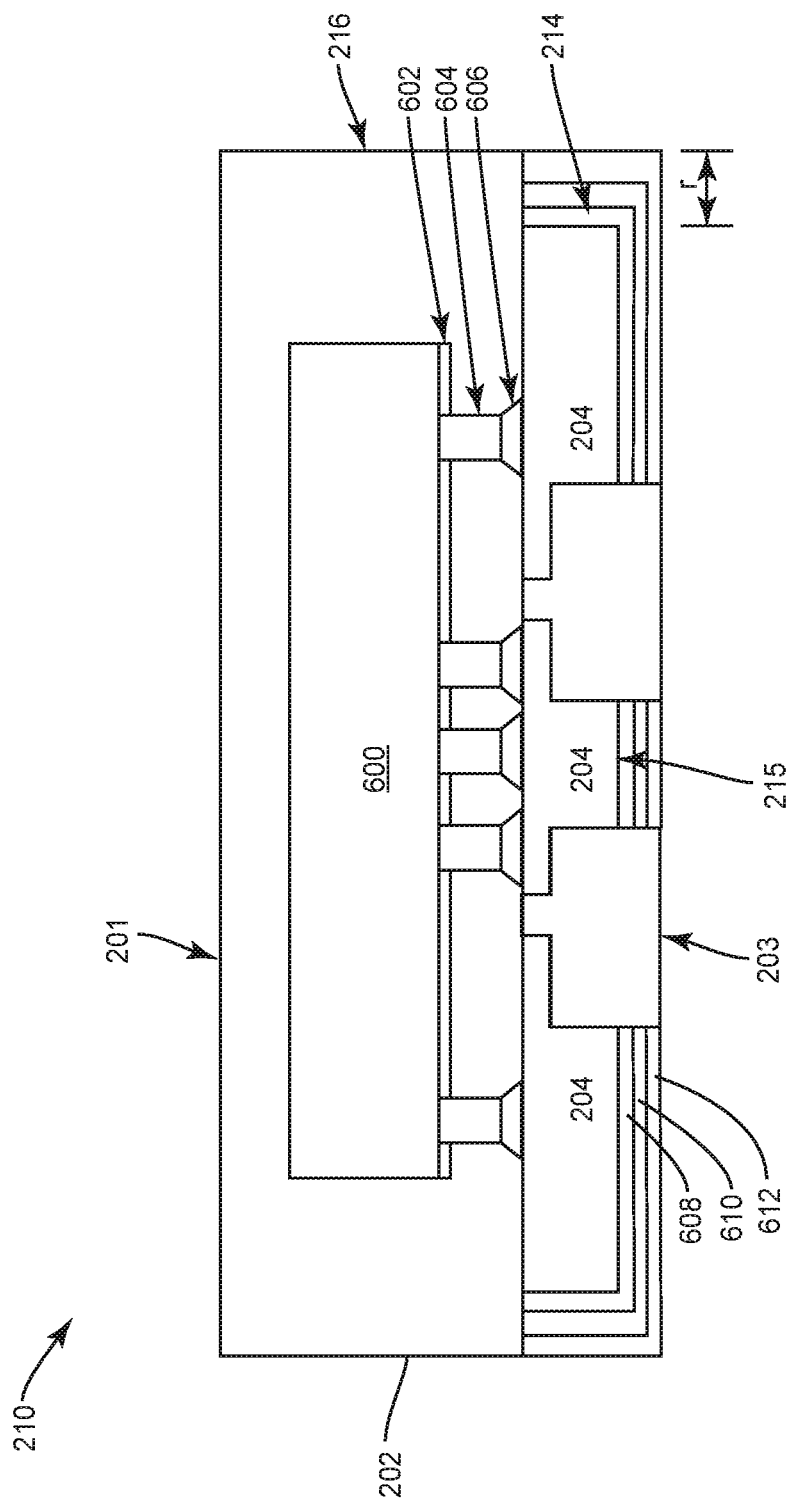
FIG. 8 illustrates a sectional view of a molded semiconductor package manufactured in accordance with the method described in accordance with FIGS. 1 through 5 and having a flip-chip configuration.

FIG. 8 illustrates a sectional view of a molded semiconductor package 210 manufactured in accordance with the method described above in connection with FIGS. 1 through 5 and having a flip-chip configuration. According to this embodiment, the molded semiconductor package 210 comprises a mold compound 202 having a first main surface 201, a second main surface 203 opposite the first main surface 201, and an edge 216 extending between the first and the second main surfaces 201, 203. One or more semiconductor dies 600 are embedded in the mold compound 202, and a plurality of metal pads 204 also embedded in the mold compound 202 are electrically connected to each semiconductor die 600.

In a flip-chip configuration, the bottom side of the semiconductor die 600 embedded in the mold compound 202 has terminals for providing electrical connections to the semiconductor die 600. A passivation layer 602 such as silicon nitride can be applied to the bottom side of the semiconductor die 600. The metal pads 204 can be leads of a leadframe. Connections can be provided between the terminals of the semiconductor die 600 and the leads of the leadframe i.e. the metal pads 204 by copper pillars 604 which are attached to the corresponding lead by a solder joint 606.

The metal pads 204 have a bottom face 215 which is uncovered by the mold compound 202 at the second main surface 203 of the mold compound 202. The metal pads 204 disposed around the periphery of the molded package 210 also have a side face 214 which is uncovered by the mold compound 202 at the edge 216 of the mold compound 202 i.e. the cut face of the mold compound 202. The faces 214, 215 of the metal pads 204 uncovered by the mold compound 202 were previously roughened and plated e.g. with a layer of nickel-phosphorus or nickel-boron alloy 608 and a layer of gold 610 after the package singulation process as previously described herein in connection with FIGS. 1 through 5. The post-singulation roughening/de-burring process etched away about 3 to 15 microns of metal from the faces 214, 215 of the metal pads 204 uncovered by the mold compound 202. As such, the side face 214 of each metal pad 204 disposed around the periphery of the molded package 210 is recessed inward by an amount r from the edge 216 of the mold compound 202. The bottom faces 215 of all metal pads 204 are also recessed inward from the bottom face 203 of the mold compound 202 by the same amount.

In some embodiments, the metal pads 204 comprise copper. The faces 214, 215 of the metal pads 204 uncovered by the mold compound 202 can have a palladium-catalyzed copper surface which is plated with a layer of nickel-phosphorus or nickel-boron alloy 608 as previously described herein. The plated faces 214, 215 of the metal pads 204 can be covered with a protective layer 612 such as a high temperature antioxidant coating and which can comprise an organic compound such as organophosphorous, organaosilane or a mixture of organophosphorous and organaosilane also as previously described herein. In each case, the plated side faces 214 of the metal pads 204 disposed around the periphery of the molded package 210 provide the LTI feature.

Figure 9:
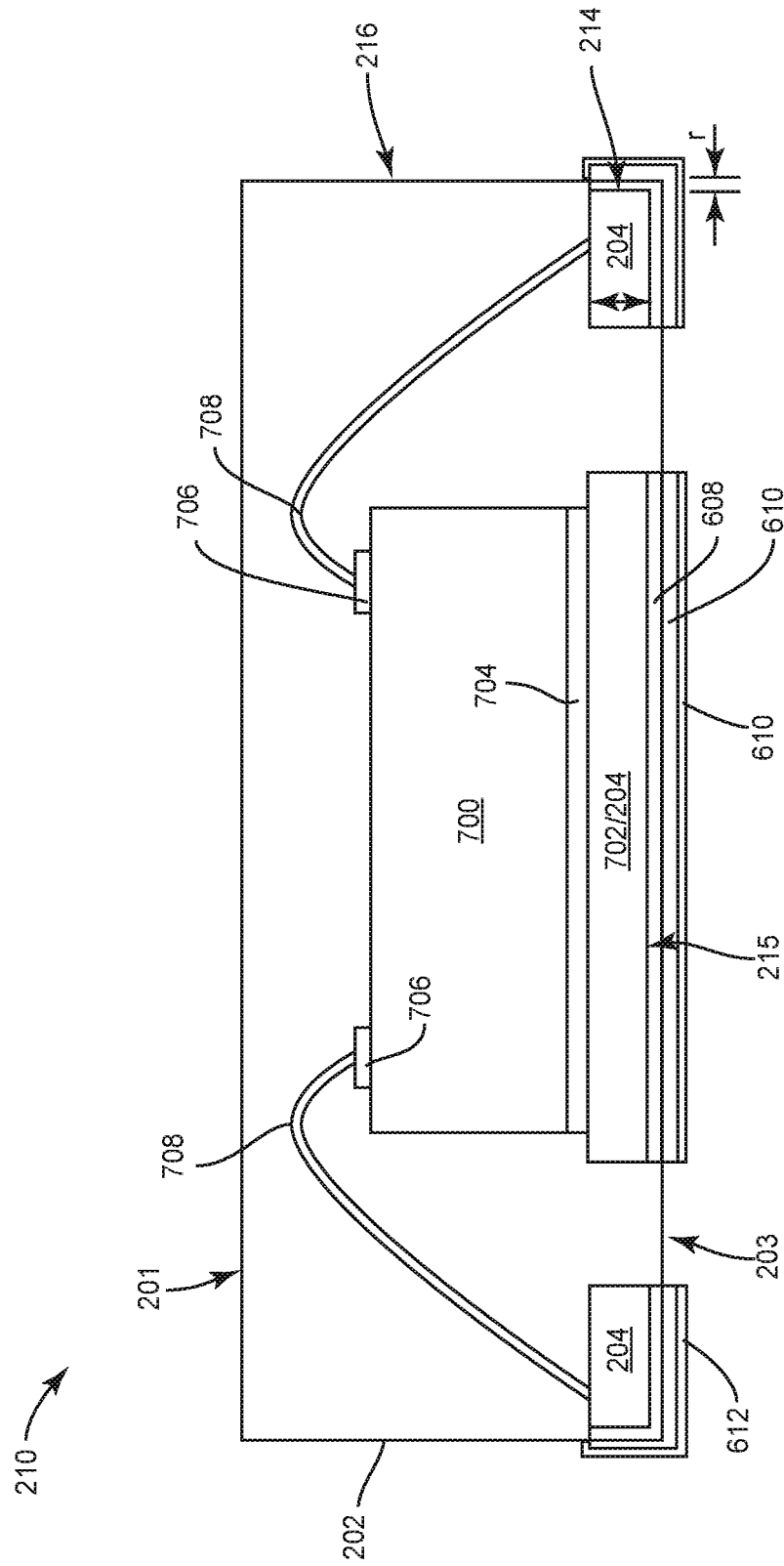
FIG. 9 illustrates a sectional view of a molded semiconductor package manufactured in accordance with the method described in accordance with FIGS. 1 through 5 and having a wire bond configuration.

FIG. 9 illustrates a sectional view of a molded semiconductor package 210 manufactured in accordance with the method described above in connection with FIGS. 1 through 5 and having a wire bond configuration. According to this embodiment, the molded semiconductor package 210 comprises a mold compound 202 having a first main surface 201, a second main surface 203 opposite the first main surface 201, and an edge 216 extending between the first and the second main surfaces 201, 203. One or more semiconductor dies 700 are embedded in the mold compound 202, and a plurality of metal pads 204 also embedded in the mold compound 202 are electrically connected to each semiconductor die 700.

In a wire bond configuration, the bottom side of the semiconductor die 700 embedded in the mold compound 202 is attached to a die paddle 702 of a leadframe e.g. by a solder joint 704. The bottom side of the semiconductor die 700 can form one terminal of the die 700 in the case of a vertical device or, no terminal in the case of a lateral device. In either case, one or more additional terminals 706 are present at the top side of the semiconductor die 700 facing away from the die paddle 702. The top-side terminals 706 are connected to leads of the leadframe by wire bonds 708. The leads of the lead frame form the metal pads 204 of the molded package 210. In one embodiment, the side face 214 of each metal pad 204 disposed around the periphery of the molded package 210 has the same height h as the leadframe as shown in FIG. 9.

The metal pads 204 have a bottom face 215 which is uncovered by the mold compound 202 at the second main surface 203 of the mold compound 202. The metal pads 204 disposed around the periphery of the molded package 210 also have a side face 214 which is uncovered by the mold compound 202 at the edge 216 of the mold compound 202 i.e. the cut face of the mold compound 202. The faces 214, 215 of the metal pads 204 uncovered by the mold compound 202 were roughened and plated e.g. with a layer of nickel-phosphorus or nickel-boron alloy 608 and a layer of gold 610 after the package singulation process as previously described herein in connection with FIGS. 1 through 5. The post-singulation roughening/de-burring process etched away about 3 to 15 microns of metal from the faces 214, 215 of the metal pads 204 uncovered by the mold compound 202. As such, the side face 214 of each metal pad 204 disposed around the periphery of the molded package 210 is recessed inward by an amount r from the edge 216 of the mold compound 202. The bottom face 215 of all metal pads 204 are also recessed inward from the bottom face 203 of the mold compound 202 by the same amount.

In some embodiments, the metal pads 204 comprise copper. The faces 214, 215 of the metal pads 204 uncovered by the mold compound 202 can have a palladium-catalyzed copper surface which is plated with a layer of nickel-phosphorus or nickel-boron alloy 608 as previously described herein. The plated faces 214, 215 of the metal pads 204 can be covered with a protective layer 612 such as a high temperature antioxidant coating and which can comprise an organic compound such as organophosphorous, organaosilane or a mixture of organophosphorous and organaosilane also as previously described herein. In each case, the plated side faces 214 of the metal pads 204 provide the LTI feature.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a" "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A molded semiconductor package, comprising:
a mold compound having a first main surface, a second main surface opposite the main surface, and an edge extending between the first and the second main surfaces;
a semiconductor die embedded in the mold compound; and
a plurality of metal pads embedded in the mold compound and electrically connected to the semiconductor die,
wherein the metal pads have a bottom face which is uncovered by the mold compound at the second main surface of the mold compound,
wherein the metal pads disposed around a periphery of the molded package have a side face which is uncovered by the mold compound at the edge of the mold compound,
wherein the entire side face of each metal pad disposed around the periphery of the molded package is plated and recessed inward from the edge of the mold compound.

2. The molded semiconductor package of claim 1, wherein the entire side face of each metal pad disposed around the periphery of the molded package is plated with a layer of nickel-phosphorus or nickel-boron alloy and a layer of gold.

3. The molded semiconductor package of claim 2, wherein the metal pads comprise copper, and wherein the entire side face of each metal pad disposed around the periphery of the molded package has a palladium-catalyzed copper surface which is plated with the layer of nickel-phosphorus or nickel-boron alloy.

4. The molded semiconductor package of claim 1, wherein the plated side faces of the metal pads disposed around the periphery of the molded package are covered with a protective layer.

5. The molded semiconductor package of claim 4, wherein the protective layer is an antioxidant coating.

6. The molded semiconductor package of claim 4, wherein the protective layer comprises organophosphorous, organaosilane or a mixture of organophosphorous and organaosilane.

7. The molded semiconductor package of claim 1, wherein the entire side face of each metal pad disposed around the periphery of the molded package is recessed inward from the edge of the mold compound by between 3 to 15 microns.

8. The molded semiconductor package of claim 1, wherein the metal pads are leads of a leadframe, and wherein the side face of each metal pad disposed around the periphery of the molded package has the same height as the leadframe.

9. A molded semiconductor package, comprising:
a mold compound having a first main surface, a second main surface opposite the main surface, and an edge extending between the first and the second main surfaces;
a semiconductor die embedded in the mold compound; and
a plurality of metal pads embedded in the mold compound and electrically connected to the semiconductor die,
wherein the metal pads have a bottom face which is uncovered by the mold compound at the second main surface of the mold compound,
wherein the metal pads disposed around a periphery of the molded package have a side face which is uncovered by the mold compound at the edge of the mold compound,
wherein the entire bottom face of each metal pad is plated and recessed inward from the second main surface of the mold compound.

10. The molded semiconductor package of claim 9, wherein the metal pads comprise copper, and wherein the entire bottom face of each metal pad has a palladium-catalyzed copper surface which is plated with a layer of nickel-phosphorus or nickel-boron alloy.

11. The molded semiconductor package of claim 9, wherein the bottom face of each metal pad is covered with a protective layer.

12. The molded semiconductor package of claim 11, wherein the protective layer is an antioxidant coating.

13. The molded semiconductor package of claim 11, wherein the protective layer comprises organophosphorous, organaosilane or a mixture of organophosphorous and organaosilane.

14. The molded semiconductor package of claim 9, wherein the metal pads are leads of a leadframe, and wherein the side face of each metal pad disposed around the periphery of the molded package has the same height as the leadframe.

15. A molded semiconductor package, comprising:
a mold compound having a first main surface, a second main surface opposite the main surface, and an edge extending between the first and the second main surfaces;
a semiconductor die embedded in the mold compound; and
a plurality of metal pads embedded in the mold compound and electrically connected to the semiconductor die,
wherein the metal pads have a bottom face which is uncovered by the mold compound at the second main surface of the mold compound,
wherein the metal pads disposed around a periphery of the molded package have a side face which is uncovered by the mold compound at the edge of the mold compound,
wherein the entire side face of each metal pad disposed around the periphery of the molded package is plated and recessed inward from the edge of the mold compound,
wherein the entire bottom face of each metal pad is plated and recessed inward from the second main surface of the mold compound.

16. The molded semiconductor package of claim 15, wherein each face of the metal pads uncovered by the mold compound is plated with a layer of nickel-phosphorus or nickel-boron alloy and a layer of gold.

17. The molded semiconductor package of claim 16, wherein the metal pads comprise copper, and wherein each face of the metal pads uncovered by the mold compound has a palladium-catalyzed copper surface which is plated with the layer of nickel-phosphorus or nickel-boron alloy.

18. The molded semiconductor package of claim 15, wherein each plated face of the metal pads is covered with an antioxidant coating.

19. The molded semiconductor package of claim 15, wherein each plated face of the metal pads is covered with organophosphorous, organaosilane or a mixture of organophosphorous and organaosilane.

20. The molded semiconductor package of claim 15, wherein the metal pads are leads of a leadframe, and wherein the side face of each metal pad disposed around the periphery of the molded package has the same height as the leadframe.

21. The molded semiconductor package of claim 15, wherein the entire side face of each metal pad disposed around the periphery of the molded package is recessed inward from the edge of the mold compound by a first amount, and wherein the entire bottom face of each metal pad is recessed inward from the second main surface of the mold compound by the same first amount.

* * * * *